(12) United States Patent
Song et al.

(10) Patent No.: US 10,782,254 B2
(45) Date of Patent: Sep. 22, 2020

(54) METHOD OF DETECTING A DEFECT AND APPARATUS FOR PERFORMING THE SAME

(71) Applicant: SAMSUNG ELECTRONICS CO., LTD., Suwon-si, Gyeonggi-do (KR)

(72) Inventors: Hyon-Seok Song, Suwon-si (KR); In-Yong Kang, Seoul (KR); Jong-Ju Park, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 46 days.

(21) Appl. No.: 16/039,647

(22) Filed: Jul. 19, 2018

(65) Prior Publication Data

US 2019/0162681 A1   May 30, 2019

(30) Foreign Application Priority Data

Nov. 29, 2017 (KR) .................. 10-2017-0161876

(51) Int. Cl.
| | |
|---|---|
| *G01N 23/2251* | (2018.01) |
| *G06T 7/00* | (2017.01) |
| *H01J 37/28* | (2006.01) |
| *G03F 1/86* | (2012.01) |
| *H01L 21/67* | (2006.01) |
| *H01L 21/66* | (2006.01) |

(52) U.S. Cl.
CPC .......... *G01N 23/2251* (2013.01); *G03F 1/86* (2013.01); *G06T 7/0004* (2013.01); *H01J 37/28* (2013.01); *G01N 2223/3302* (2013.01); *G01N 2223/3308* (2013.01); *G01N 2223/401* (2013.01); *G01N 2223/426* (2013.01); *G01N 2223/507* (2013.01); *G01N 2223/646* (2013.01); *G06T 2207/30148* (2013.01); *H01L 21/67288* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 5,125,040 A | 6/1992 | Matsui et al. | |
| 6,400,839 B1 | 6/2002 | Takayama | |
| 8,760,642 B2 | 6/2014 | Hori et al. | |
| 8,811,713 B2 | 8/2014 | Yoshikawa | |
| 9,281,164 B2 | 3/2016 | Wu et al. | |

(Continued)

FOREIGN PATENT DOCUMENTS

| | | |
|---|---|---|
| KR | 10-2008-0038796 A | 5/2008 |
| KR | 10-2009-0074552 A | 7/2009 |

OTHER PUBLICATIONS

Chen, Improving Inspectability With KLA-Tencor Terascan Thin Line De-Sense, SPIE vol. 6730, 67303O-1.

*Primary Examiner* — Andrew Smyth
(74) *Attorney, Agent, or Firm* — Lee IP Law, PC

(57) ABSTRACT

In a method of detecting a defect, a region of a substrate may be primarily scanned using a first electron beam to detect a first defect. A remaining region of the substrate, which may be defined by excluding a portion in which the first defect may be positioned from the region of the substrate, may be secondarily scanned using a second electron beam to detect a second defect. Thus, the portion with the defect may not be scanned in a following scan process so that a scanning time may be remarkably decreased.

17 Claims, 6 Drawing Sheets

(56) References Cited

U.S. PATENT DOCUMENTS

| | | | | |
|---|---|---|---|---|
| 2003/0007677 A1* | 1/2003 | Hiroi | ............... | G06T 7/001 |
| | | | | 382/149 |
| 2003/0111616 A1* | 6/2003 | Suzuki | ............... | H01J 37/28 |
| | | | | 250/492.2 |
| 2004/0207414 A1* | 10/2004 | Verma | ............... | G01R 31/307 |
| | | | | 324/754.22 |
| 2013/0322736 A1* | 12/2013 | Yu | ............... | G06T 7/001 |
| | | | | 382/149 |
| 2013/0336575 A1* | 12/2013 | Dalla-Torre | ............... | G06T 7/001 |
| | | | | 382/149 |

* cited by examiner

METHOD OF DETECTING A DEFECT AND APPARATUS FOR PERFORMING THE SAME

CROSS-REFERENCE TO RELATED APPLICATION

Korean Patent Application No. 10-2017-0161876, filed on Nov. 29, 2017, and entitled, "Method of Detecting a Defect and Apparatus for Performing the Same," is incorporated by reference herein in its entirety.

BACKGROUND

1. Field

One or more embodiments relate to an apparatus and method for detecting a defect.

2. Description of the Related Art

An electron beam may be used to detect a defect on a substrate. According to one method, the entire surface of the substrate may be scanned several times using the electron beam to obtain an average image. The average image may be then compared to a reference image to detect the defect.

This method may have several drawbacks. For example, the entire surface of the substrate may be scanned several times using the electron beam regardless of whether a defect is detected. Thus, the scanning time may be long. Further, the defect may be detected using the same sensitivity regardless of the size of the defect. Thus, very small defects may not be detected. A high sensitivity may be used for detecting very small defects. However, when a high sensitivity is used for the entire surface of the substrate, the time for detecting the defect may be increased.

SUMMARY

In accordance with one or more embodiments, a method of detecting a defect includes primarily scanning a region of a substrate using a first electron beam, detecting a first defect; secondarily scanning a first remaining region of the substrate using a second electron beam; and detecting a second defect, wherein the first remaining region of the substrate is defined by excluding a first portion in which the first defect is positioned from the region of the substrate.

In accordance with one or more other embodiments, a method for detecting a defect includes scanning an entire region of a substrate using a preliminary electron beam, obtaining a preliminary image; applying a preliminary defect detection sensitivity to the preliminary image, dividing the entire region of the substrate into a patterned region and a non-patterned region; primarily scanning the patterned region using a first electron beam, obtaining a first image; applying a first defect detection sensitivity to the first image, the first defect detection sensitivity higher than the preliminary defect detection sensitivity; detecting a first defect, secondarily scanning a first remaining region of the patterned region using a second electron beam, the first remaining region of the patterned region defined by excluding a first portion in which the first defect is positioned from the patterned region; obtaining a second image, applying a second defect detection sensitivity to the second image, the second defect detection sensitivity higher than the first defect detection sensitivity, and detecting a second defect.

In accordance with one or more other embodiments, an apparatus for detecting a defect includes a scanner to scan a substrate a plurality of times using an electron beam in order to detect the defect; and a controller to set a remaining region of the substrate as a scan region in the scanner, the remaining region of the substrate defined by excluding a portion in which the defect is positioned from a previously scanned region.

In accordance with one or more other embodiments, a non-transitory, computer-readable medium comprising instructions which, when executed, cause a controller to control operations of primarily scanning a region of a substrate using a first electron beam; detecting a first defect; secondarily scanning a first remaining region of the substrate using a second electron beam; and detecting a second defect, wherein the first remaining region of the substrate is defined by excluding a first portion in which the first defect is positioned from the region of the substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
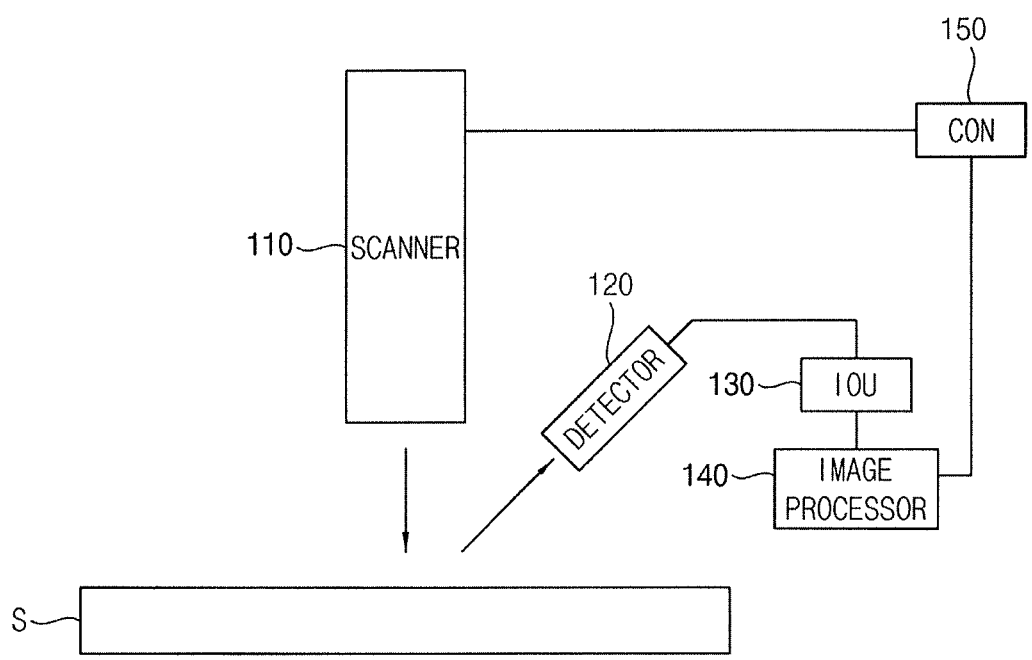
FIG. 1 illustrates an embodiment of an apparatus for detecting a defect.

FIG. 1 illustrates an embodiment of an apparatus for detecting a defect on a substrate S using an electron beam. The substrate S may include a mask substrate. The mask substrate may include, for example, an extreme ultraviolet (EUV) mask substrate. In one embodiment, the apparatus may detect the defect on a semiconductor substrate using the electron beam. The substrate S may have a patterned region and a non-patterned region.

The apparatus may include a scanner and a controller (CON) 150. The scanner may scan the substrate S several times to detect the defect. The controller 150 may set a remaining region as a scan region in the scanner. The remaining region may be defined by excluding a portion in which the defect may be positioned from a previously scanned region of the substrate.

The scanner may include a scanning unit (scanner) 110, a detecting unit (detector) 120, an image-obtaining unit (IOU) 130, and an image-processing unit (image processor) 140.

The scanning unit 110 may scan the substrate S using the electron beam. The detecting unit 120 may detect secondary electrons emitted from the substrate S scanned by the electron beam. The image-obtaining unit 130 may obtain an image from the secondary electrons. The image-processing unit 140 may process the image to detect the defect.

The scanning unit 110 may irradiate the electron beam to a surface of the substrate S. The scanning unit 110 may be horizontally moved over the substrate S to scan the surface of the substrate S. In one embodiment, the substrate S may be horizontally moved while the position of the scanning unit 110 is fixed.

The visibility of the image obtained by the image-obtaining unit 130 may be determined based on the intensity of the electron beam irradiated from the scanning unit 110. When the intensity of the electron beam is relatively low (e.g., below a predetermined value), the visibility of the image obtained by the image-obtaining unit 130 may also be low (e.g., below a predetermined level). When the intensity of the electron beam is relatively high (e.g., above a predetermined value), the visibility of the image obtained by the image-obtaining unit 130 may also be high (e.g., above a predetermined level).

The image-processing unit 140 may compare the image with a reference image to detect the defect. The reference image may correspond to an image of a normal substrate without the defect. In example embodiments, the image-processing unit 140 may compare a voltage from the image with a voltage from the reference image to calculate a voltage difference between the voltages. The image-processing unit 140 may apply a predetermined defect detection sensitivity to the voltage difference between the image and the reference image to detect the defect. For example, when the voltage difference is below the predetermined defect detection sensitivity, the image-processing unit 140 may determine that the substrate S does not have a defect. When the voltage difference is not less than the predetermined defect detection sensitivity, the image-processing unit 140 may determine that the substrate S has a defect. The image-processing unit 140 may also detect the position of the defect on the substrate S. Thus, the image-processing unit 140 may have defect detectability that varies with the defect detection sensitivity.

The controller 150 may set the scan region of the scanning unit 110, e.g., an inspection region. For example, the controller 150 may gradually decrease the inspection region of the scanning unit 110 in accordance with the scan times. In example embodiments, the controller 150 may exclude a portion in which the defect may be detected by a previous scanning from a following scan region. Thus, the following scan region may correspond to a region defined by excluding the portion in which the defect is detected by the previous scanning from the previously scanned region. Further, the controller 150 may exclude the non-patterned region of the substrate S from the inspection region. For example, the controller 150 may set only the patterned region of the substrate S as the inspection region.

The controller 150 may gradually increase the defect detection sensitivity in proportion to the scanning times. In one embodiment, the controller 150 may set the gradually increased defect detection sensitivity in the image-processing unit 140 in proportion to the gradually decreased inspection region based on the scanning times.

Further, the controller 150 may gradually increase the intensity of the electron beam in accordance with the scanning times. For example, the controller 150 may gradually increase the intensity of the electron beam irradiated to the gradually decreased inspection region based on the scanning times.

In example embodiments, when the scanning unit 110 scans the whole surface of the substrate S using a preliminary electron beam, the image-obtaining unit 130 may obtain a preliminary image. The controller 150 may set a preliminary defect detection sensitivity in the image-processing unit 140. The image-processing unit 140 may apply the preliminary defect detection sensitivity to a voltage difference between the preliminary image and the reference image, in order to divide the substrate S into the patterned region and the non-patterned region. The controller 150 may exclude the non-patterned region from the scan region of the scanning unit 110. Thus, a first inspection region of the scanning unit 110 may correspond to the patterned region.

The scanning unit 110 may primarily scan only the first inspection region of the substrate S, e.g., the patterned region using a first electron beam. The image-obtaining unit 130 may obtain a first image of the patterned region. When the first inspection region includes only the patterned region, a first scanning time may be less than a preliminary scanning time.

The controller 150 may provide the first electron beam with an intensity higher than that of the preliminary electron beam. Thus, the first image obtained by the image-obtaining unit 130 may have a visibility higher than that of the preliminary image. The controller 150 may set a first defect detection sensitivity higher than the preliminary defect detection sensitivity in the image-processing unit 140. The image-processing unit 140 may apply the first defect detection sensitivity to a voltage difference between the first image and the reference image, in order to detect a first defect and a position of the first defect on the substrate S. The controller 150 may exclude a first portion in which the first defect is positioned from a second inspection region. Therefore, the second inspection region of a following scanning process may correspond to a first remaining region of the first inspection region, defined by excluding the portion in which the first defect is positioned from the first inspection region.

The scanning unit 110 may secondarily scan only the second inspection region of the substrate S, e.g., the first remaining region in the patterned region except for the region in which the first defect may be detected using a second electron beam. The image-obtaining unit 130 may obtain a second image of the second inspection region. When the second inspection region includes only the first remaining region in the first inspection region except for the first portion in which the first defect is detected, a second scanning time may be less than the first scanning time.

The controller 150 may provide the second electron beam with intensity higher than that of the first electron beam. Thus, the second image obtained by the image-obtaining unit 130 may have a visibility higher than that of the first image. The controller 150 may set a second defect detection sensitivity higher than the first defect detection sensitivity in the image-processing unit 140. The image-processing unit 140 may apply the second defect detection sensitivity to a voltage difference between the second image and the reference image to detect a second defect and a position of the second defect on the substrate S.

The second defect may have a size smaller than that of the first defect. The controller 150 may exclude a second portion in which the second defect is positioned from a third inspection region. Therefore, the third inspection region of a following scanning process may correspond to a second remaining region of the second inspection region, defined by excluding the second portion in which the second defect may be positioned from the second inspection region.

The scanning unit 110 may tertiarily scan only the third inspection region of the substrate S, e.g., the second remaining region in the patterned region except for the portions in which the first and second defects is positioned using a third electron beam. The image-obtaining unit 130 may obtain a third image of the third inspection region. When the third inspection region includes only the second remaining region in the second inspection region except for the second portion in which the second defect may be positioned, a third scanning time may be less than the second scanning time.

The controller 150 may provide the third electron beam with intensity higher than that of the second electron beam. Thus, the third image obtained by the image-obtaining unit 130 may have a visibility higher than that of the second image. The controller 150 may set a third defect detection sensitivity higher than the second defect detection sensitivity in the image-processing unit 140. The image-processing unit 140 may apply the third defect detection sensitivity to a voltage difference between the third image and the reference image, in order to detect a third defect and a position of the third defect on the substrate S. The size of the third defect may be smaller than the second defect.

When the third defect detection sensitivity corresponds to the highest defect detection sensitivity, a very small defect (e.g., one which may not detected using the third defect detection sensitivity) may not cause a failure of a semiconductor device. In this case, the controller 150 may complete the operations of the scanner.

When the third defect detection sensitivity is lower than the highest defect detection sensitivity, the controller 150 may operate the above-mentioned operations of the scanning unit 110 and the image-processing unit 140 under a condition that a portion in which the third defect is positioned is excluded from a fourth scan region of the scanning unit 110. The following operations of the scanning unit 110, the image-processing unit 140, and the controller 150 may be performed until the highest (or other predetermined) defect detection sensitivity may be used.

Figure 2:
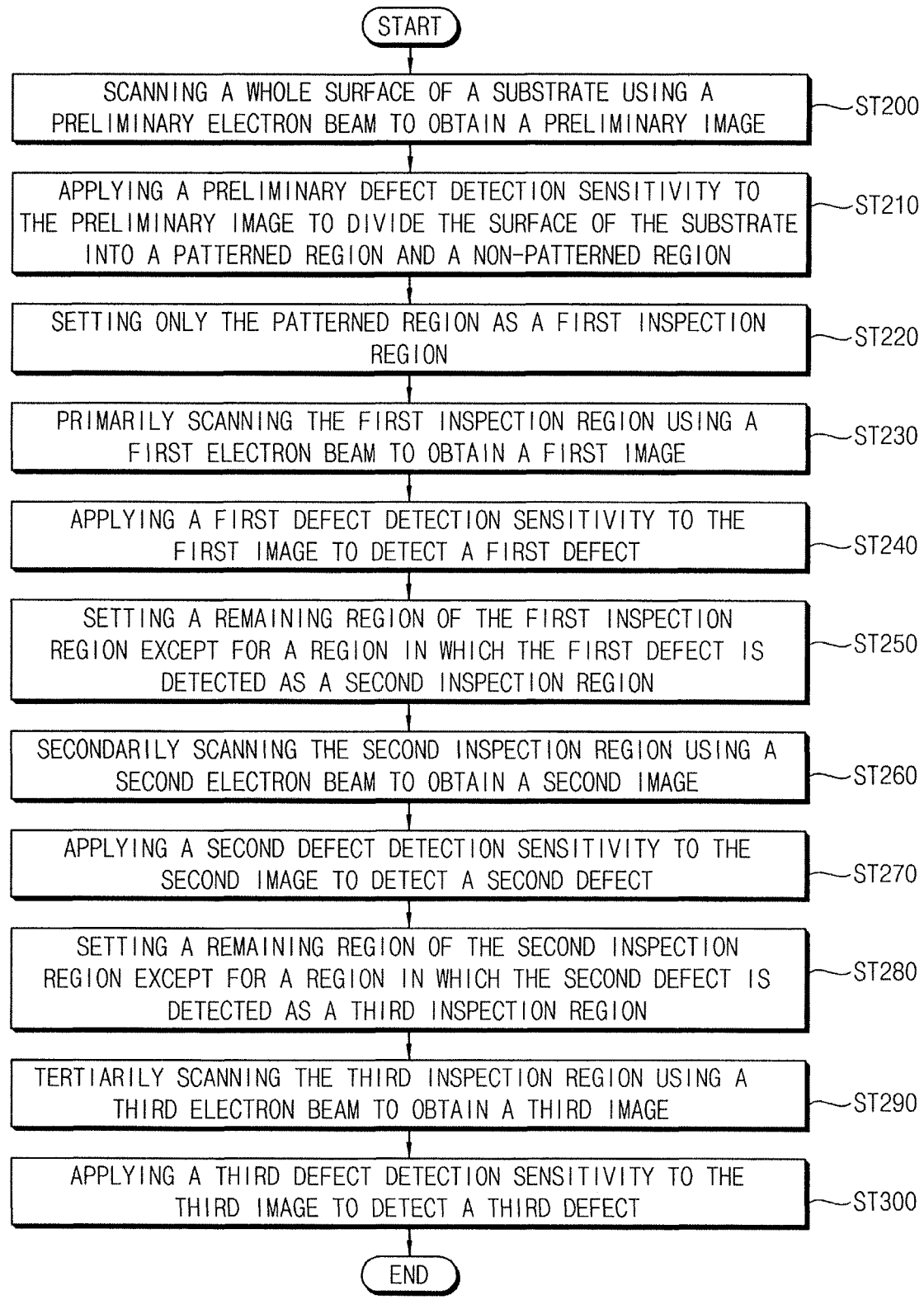
FIG. 2 illustrates an embodiment of a method for detecting a defect.
Figure 3:
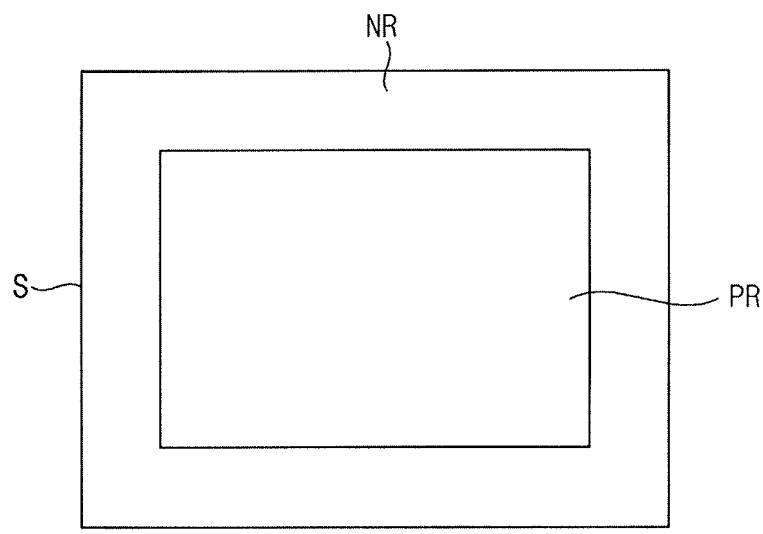
FIG. 3 illustrates an embodiment of a substrate having a pattered region and a non-patterned region.
Figure 4:
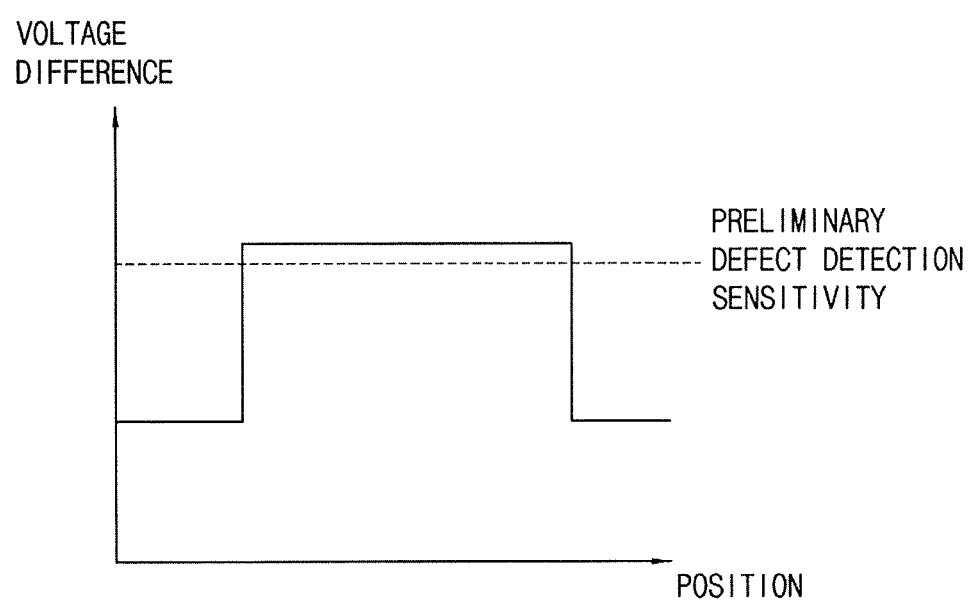
FIG. 4 illustrates an example of a voltage difference between a reference image and a preliminary image.

FIG. 2 illustrates an embodiment of a method for detecting a defect, which method may be performed using, for example, the apparatus in FIG. 1. FIG. 3 illustrates an example of a substrate having a pattered region and a non-patterned region by preliminary scanning. FIG. 4 illustrates an example of a voltage difference between a reference image and a preliminary image obtained by the preliminary scanning of FIG. 3.

Figure 5:
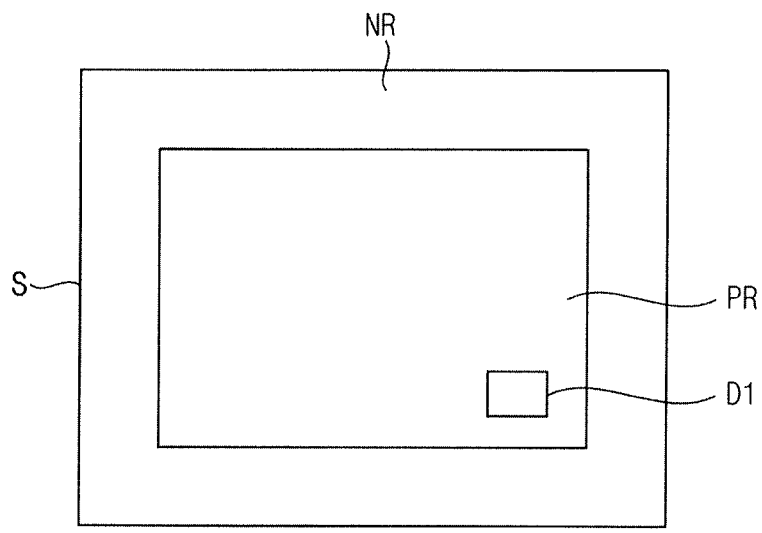
FIG. 5 illustrates an example of a substrate having a region in which a first defect is detected by primary scanning.
Figure 6:
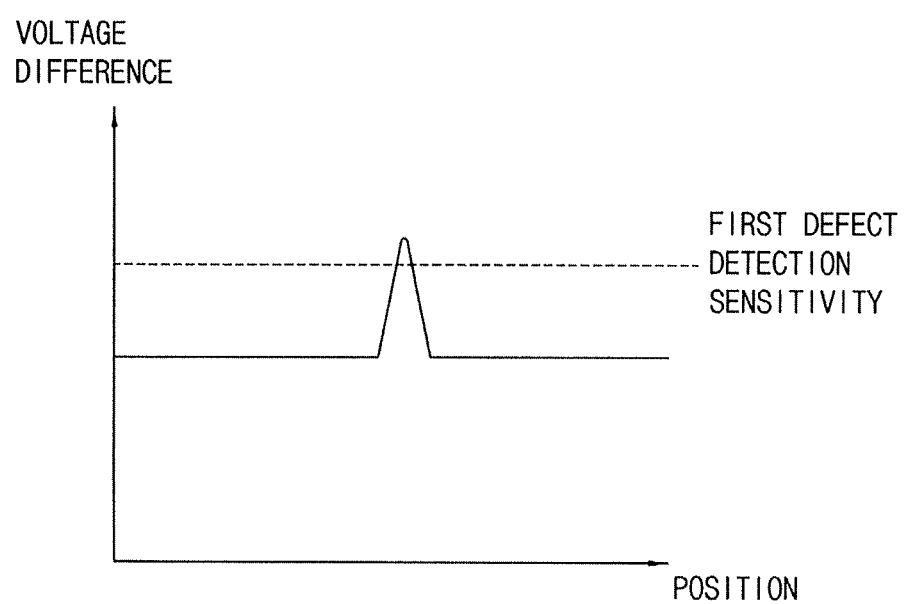
FIG. 6 illustrates an example of a voltage difference between the reference image and a first image obtained by the primary scanning.

FIG. 5 illustrates an example of a substrate having a region in which a first defect is detected by primary scanning. FIG. 6 illustrates an example of a voltage difference between the reference image and a first image obtained by the primary scanning of FIG. 5.

Figure 7:
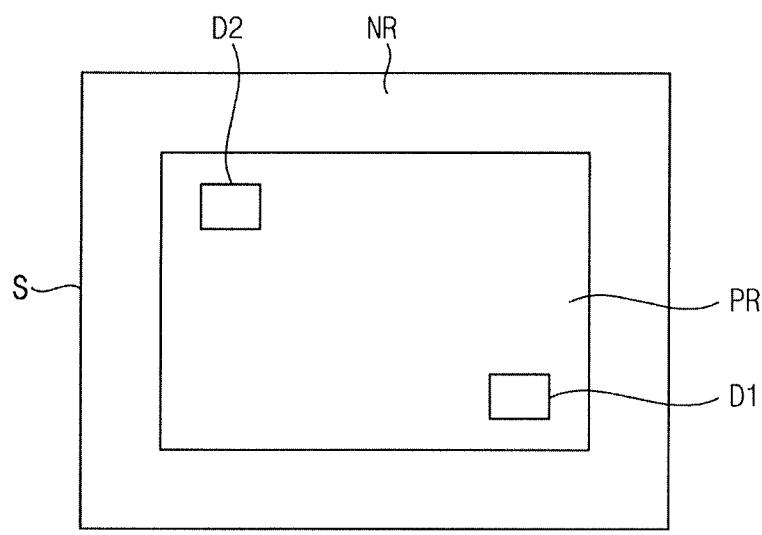
FIG. 7 illustrates an example of a substrate having a region in which a second defect is detected by secondary scanning.
Figure 8:
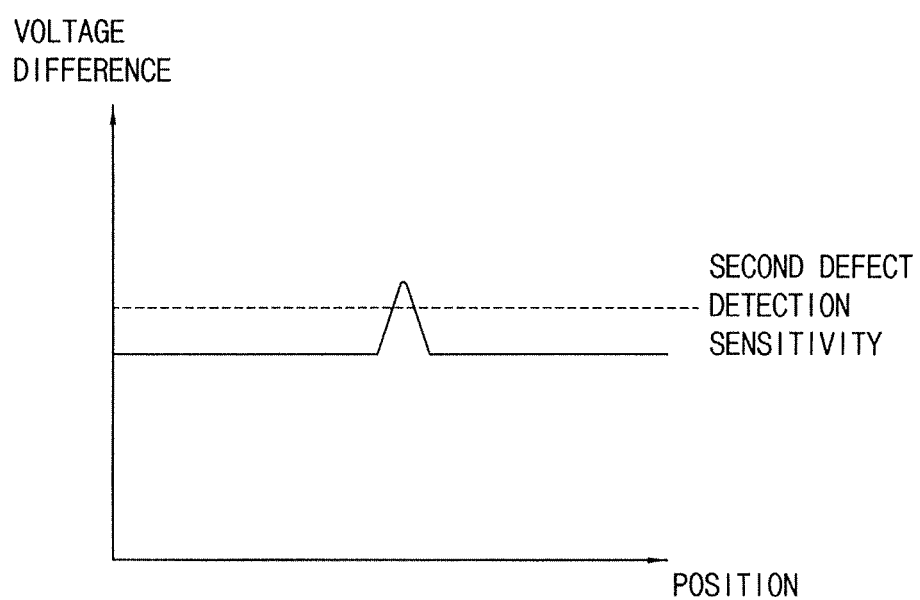
FIG. 8 illustrates an example of a voltage difference between the reference image and a second image.

FIG. 7 illustrates an example of a substrate having a region in which a second defect is detected by secondary scanning. FIG. 8 illustrates an example of a voltage difference between the reference image and a second image obtained by the secondary scanning of FIG. 7.

Figure 9:
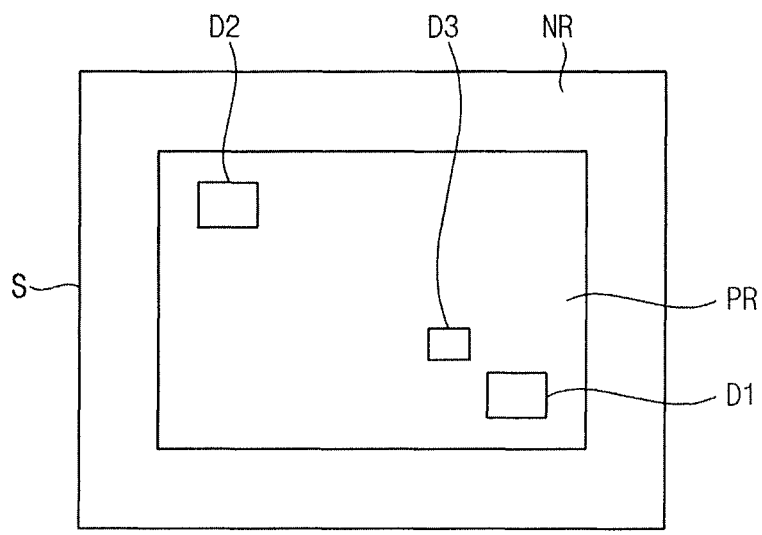
FIG. 9 illustrates an example of a substrate having a region in which a third defect is detected by tertiary scanning.
Figure 10:
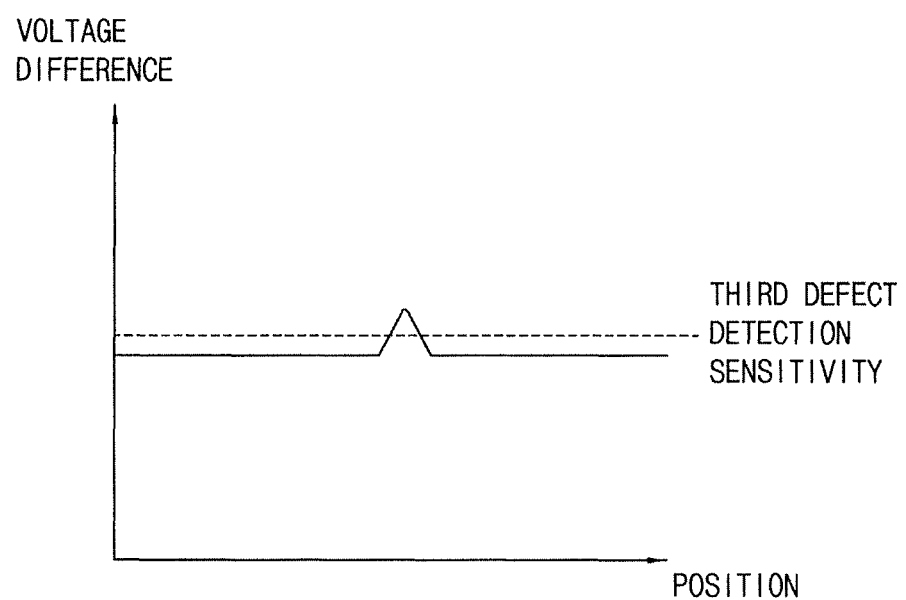
FIG. 10 illustrates an example of a voltage difference between the reference image and a third image.

FIG. 9 illustrates an example of a substrate having a region in which a third defect is detected by tertiary scanning. FIG. 10 illustrates an example of a voltage difference between the reference image and a third image obtained by the tertiary scanning of FIG. 9.

Referring to FIGS. 1 to 10, in operation ST200, the scanning unit 110 may scan the entire surface of the substrate S using the preliminary electron beam. The detecting unit 120 may detect the secondary electrons emitted from the surface of the substrate S to which the preliminary electron beam is irradiated. The image-obtaining unit 130 may obtain the preliminary image from the detected secondary electrons.

The patterned region PR and the non-patterned region NR on the substrate S may be accurately distinguished from each other. Thus, it may not be required to provide the preliminary image with high visibility for distinguishing the patterned region PR from the non-patterned region NR. Therefore, the controller 150 may provide the preliminary electron beam irradiated from the scanning unit 110 with a relative lower predetermined intensity. As a result, the preliminary image obtained by the image-obtaining unit 130 may have relatively lower visibility.

In operation ST210, the image-processing unit 140 may apply the preliminary defect detection sensitivity to the preliminary image, in order to distinguish the patterned region PR from the non-patterned region NR on the surface of the substrate S in FIG. 3.

The image-processing unit 140 may compare the preliminary image with the reference image. In one embodiment, the image-processing unit 140 may measure the voltage difference between the preliminary image and the reference image. As illustrated in FIG. 4, because the voltage difference between the patterned region PR and the non-patterned region NR is relatively large (e.g., above a predetermined level), the image-processing unit 140 may apply low preliminary defect detection sensitivity to the voltage difference between the patterned region PR and the non-patterned region NR, in order to discriminate the patterned region PR from the non-patterned region NR on the substrate S.

In operation ST220, the controller 150 may set only the patterned region PR as the first inspection region. For example, the first inspection region may correspond to a region defined by excluding the non-patterned region NR from the whole surface of the substrate S.

In operation ST230, the scanning unit 110 may primarily scan only the first inspection region, e.g., the patterned region PR using the first electron beam. The detecting unit 120 may detect the secondary electrons emitted from the first inspection region to which the first electron beam may be irradiated. The image-obtaining unit 130 may obtain the first image from the detected secondary electrons. The first image may correspond to an image of the first inspection region, e.g., the image of the patterned region PR.

The controller 150 may provide the first electron beam irradiated from the scanning unit 110 with an intensity higher than that of the preliminary electron beam. Thus, the first image obtained by the image-obtaining unit 130 may have a visibility higher than that of the preliminary image.

In operation ST240, the image-processing unit 140 may apply the first defect detection sensitivity to the first image, in order to detect the first defect on the first inspection region in FIG. 5.

The image-processing unit 140 may compare the first image with the reference image. In one embodiment, the image-processing unit 140 may measure the voltage difference between the first image and the reference image. As illustrated in FIG. 6, because the voltage difference caused by the first defect may be less than the voltage difference caused by the patterned region PR, the first defect may not be detected using the preliminary defect detection sensitivity. Thus, the image-processing unit 140 may apply the first defect detection sensitivity (which is higher than the preliminary defect detection sensitivity) to the voltage difference between the first image and the reference image, in order to detect the first defect and a portion D1 of the first defect on the first inspection region of the substrate S.

In operation ST250, the controller 150 may set a first remaining region of the first inspection region (which may be defined by excluding the first portion D1 in which the first defect is positioned from the first inspection region) as the second inspection region. For example, the second inspection region may correspond to a region defined by excluding the first defect detection portion D1 from the first inspection region.

In operation S1260, the scanning unit 110 may secondarily scan only the second inspection region using the second electron beam. The detecting unit 120 may detect the secondary electrons emitted from the second inspection region to which the second electron beam is irradiated. The image-obtaining unit 130 may obtain the second image from the detected secondary electrons. The second image may correspond to an image of the second inspection region.

The controller 150 may provide the second electron beam irradiated from the scanning unit 110 with the intensity higher than that of the first electron beam. Thus, the second image obtained by the image-obtaining unit 130 may have a visibility higher than that of the first image.

In operation ST270, the image-processing unit 140 may apply the second defect detection sensitivity to the second image, in order to detect the second defect on the second inspection region in FIG. 7. The size of the second defect may be smaller than that of the first defect.

The image-processing unit 140 may compare the second image with the reference image. In one embodiment, the image-processing unit 140 may measure the voltage difference between the second image and the reference image. As illustrated in FIG. 8 when the voltage difference caused by the second defect is less than the voltage difference caused by the first defect, the second defect may not be detected using the first defect detection sensitivity. Thus, the image-processing unit 140 may apply the second defect detection sensitivity (which is higher than the first defect detection sensitivity) to the voltage difference between the second image and the reference image, in order to detect the second defect and a portion D2 of the second defect on the second inspection region of the substrate S.

In operation ST280, the controller 150 may set a second remaining region of the second inspection region (which may be defined by excluding the second portion D2 in which the second defect is positioned from the second inspection region) as the third inspection region. Thus, the third inspection region may correspond to a region defined by excluding the second defect detection portion D2 from the second inspection region.

In operation ST280, the scanning unit 110 may tertiarily scan only the third inspection region using the third electron beam. The detecting unit 120 may detect the secondary electrons emitted from the third inspection region to which the third electron beam is irradiated. The image-obtaining unit 130 may obtain the third image from the detected secondary electrons. The third image may correspond to an image of the third inspection region.

The controller 150 may provide the third electron beam irradiated from the scanning unit 110 with an intensity higher than that of the second electron beam. Thus, the third image obtained by the image-obtaining unit 130 may have a visibility higher than that of the second image.

In operation ST300, the image-processing unit 140 may apply the third defect detection sensitivity to the third image, in order to detect the third defect on the third inspection region in FIG. 9. The size of the third defect may be smaller than that of the second defect.

The image-processing unit 140 may compare the third image with the reference image. In one embodiment, the image-processing unit 140 may measure the voltage difference between the third image and the reference image. As illustrated in FIG. 10, when the voltage difference caused by the third defect is lower than the voltage difference caused by the second defect, the third defect may not be detected using the second defect detection sensitivity. Thus, the image-processing unit 140 may apply the third defect detection sensitivity (which is higher than the second defect detection sensitivity) to the voltage difference between the third image and the reference image, in order to detect the third defect on the third inspection region of the substrate S.

In example embodiments, the method may include a single preliminary scan process and three scanning process, e.g., the four scanning processes. In other example embodiments, the method may include a different number of scanning processes, e.g., two, three, or five or more scanning processes.

In example embodiments, the method and apparatus may detect a defect using one scanner. In other example embodiments, the method and apparatus may detect a defect using at least two scanners. For example, the method and the apparatus may detect a defect on four regions of the substrate using the four scanners.

In example embodiments, the method may be applied to detect a defect on the semiconductor substrate. Thus, a semiconductor device including the semiconductor substrate to which the method may be applied may also be included within the scope of the embodiments disclosed herein.

In example embodiments, the method may be applied to detect a defect on the mask substrate. Thus, a semiconductor device manufactured using the mask substrate to which the method may be applied may also be included within the scope of the embodiments disclosed herein.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, processors, and other signal generating and signal processing features of the embodiments disclosed herein may be implemented in non-transitory logic which, for example, may include hardware, software, or both. When implemented at least partially in hardware, the controllers, processors, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or operations of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

In accordance with one or more of the aforementioned example embodiments, a portion of a substrate in which a defect is detected by a previous scanning process may be excluded from a scan region subject to a subsequent scanning process. Thus, the region with the defect may not be scanned in the subsequent scan process. As a result, scanning time may be remarkably decreased. Further, defect detection sensitivity may be gradually increased in proportion to scanning time, which may otherwise decrease the scan region. As a result, a defect having a small size may be accurately detected. As used herein, the terms high, low, large, small, and other relative terms may be defined, for example, with respect to each other and/or relative to predetermined values or levels.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method of detecting a defect, the method comprising:
primarily scanning a region of a substrate using a first electron beam;
detecting a first defect;
secondarily scanning a first remaining region of the substrate using a second electron beam; and
detecting a second defect, wherein the first remaining region of the substrate is defined by excluding a first portion in which the first defect is positioned from the region of the substrate,
wherein detecting the first defect includes:
primarily scanning the region of the substrate using the first electron beam to obtain a first image; and
applying a first defect detection sensitivity to the first image to detect the first defect,
wherein detecting the second defect includes:
secondarily scanning the first remaining region of the substrate using the second electron beam;
obtaining a second image; and
applying a second defect detection sensitivity to the second image in order to detect the second defect, wherein the second defect detection sensitivity is higher than the first defect detection sensitivity and wherein a size of second defect is smaller than a size of the first defect, and
wherein obtaining the second image includes:
providing the second electron beam with an intensity higher than that of the first electron beam; and
secondarily scanning the first remaining region of the substrate using the second electron beam in order to provide the second image with a visibility higher than that of the first image.

2. The method of claim 1, wherein detecting the first defect includes:
measuring a voltage difference between the first image and a reference image of a normal substrate which does not include a defect; and
applying the first defect detection sensitivity to the voltage difference.

3. The method of claim 1, wherein detecting the second defect includes:
secondarily scanning the first remaining region of the substrate using the second electron beam;
obtaining a second image; and
applying a second defect detection sensitivity to the second image in order to detect the second defect, wherein the second defect detection sensitivity is higher than the first defect detection sensitivity and wherein a size of second defect is smaller than a size of the first defect.

4. The method of claim 1, wherein detecting the second defect includes:
measuring a voltage difference between the second image and a reference image of a normal substrate which does not have a defect; and
applying the second defect detection sensitivity to the voltage difference.

5. The method of claim 1, further comprising:
scanning the region of the substrate using a preliminary electron beam, and
dividing the region of the substrate into a patterned region and a non-patterned region.

6. The method of claim 5, wherein dividing the region of the substrate into the patterned region and the non-patterned region includes:
scanning the region of the substrate using the preliminary electron beam;
obtaining a preliminary image; and applying a preliminary defect detection sensitivity to the preliminary image, the preliminary defect detection sensitivity lower than a first defect detection sensitivity.

7. The method of claim 6, wherein applying the preliminary defect detection sensitivity to the preliminary image includes:
  measuring a voltage difference between the preliminary image and a reference image of a normal substrate which does not have a defect; and
  applying the preliminary defect detection sensitivity to the voltage difference.

8. The method of claim 6, wherein obtaining the preliminary image includes:
  providing the preliminary electron beam with an intensity lower than that of the first electron beam; and
  scanning the region of the substrate using the preliminary electron beam in order to provide the preliminary image with a visibility lower than that of a first image, the first image obtained by primarily scanning the region of the substrate using the first electron beam.

9. The method of claim 1, further comprising:
  tertiarily scanning a second remaining region of the substrate using a third electron beam to detect a third defect wherein the second remaining region of the substrate is defined by excluding a second portion in which the second defect is positioned from the first remaining region.

10. The method of claim 9, wherein detecting the third defect includes:
  tertiarily scanning the second remaining region of the substrate using the third electron beam;
  obtaining a third image;
  applying a third defect detection sensitivity to the third image; and
  detecting the third defect, wherein the third defect detection sensitivity is higher than a second defect detection sensitivity which is used to detect the second defect and wherein the third defect has a size smaller than a size of the second defect.

11. The method of claim 10, wherein obtaining the third image includes:
  providing the third electron beam with an intensity higher than that of the second electron beam; and
  tertiarily scanning the second remaining region of the substrate using the third electron beam in order to provide the third image with a visibility higher than that of a second image, the second image obtained by secondarily scanning the first remaining region of the substrate using the second electron beam.

12. The method of claim 10, wherein detecting the third defect includes:
  measuring a voltage difference between the third image and a reference image of a normal substrate which does not have a defect; and
  applying the third defect detection sensitivity to the voltage difference.

13. A method for detecting a defect, the method comprising:
  scanning an entire region of a substrate using a preliminary electron beam;
  obtaining a preliminary image;
  applying a preliminary defect detection sensitivity to the preliminary image;
  dividing the entire region of the substrate into a patterned region and a non-patterned region;
  primarily scanning the patterned region of the substrate using a first electron beam;
  obtaining a first image;
  applying a first defect detection sensitivity to the first image, the first defect detection sensitivity higher than the preliminary defect detection sensitivity;
  detecting a first defect;
  secondarily scanning a first remaining region of the patterned region using a second electron beam, the first remaining region of the patterned region defined by excluding a first portion in which the first defect is positioned from the patterned region;
  obtaining a second image;
  applying a second defect detection sensitivity to the second image, the second defect detection sensitivity higher than the first defect detection sensitivity; and
  detecting a second defect,
  wherein obtaining the second image includes:
    providing the second electron beam with an intensity higher than that of the first electron beam; and
    secondarily scanning the first remaining region of the substrate using the second electron beam in order to provide the second image with a visibility higher than that of the first image.

14. The method of claim 13, wherein applying the preliminary defect detection sensitivity to the preliminary image includes:
  measuring a voltage difference between the preliminary image and a reference image of a normal substrate which does not have a defect; and
  applying the preliminary defect detection sensitivity to the voltage difference.

15. The method of claim 13, wherein obtaining the preliminary image includes:
  providing the preliminary electron beam with an intensity lower than that of the first electron beam; and
  scanning the entire region of the substrate using the preliminary electron beam in order to provide the preliminary image with a visibility lower than that of the first image.

16. The method of claim 13, wherein detecting the first defect includes:
  measuring a voltage difference between the first image and a reference image of a normal substrate which does not have a defect; and
  applying the first defect detection sensitivity to the voltage difference.

17. A non-transitory, computer-readable medium comprising instructions which, when executed, cause a controller to control operations of:
  primarily scanning a region of a substrate using a first electron beam;
  detecting a first defect;
  secondarily scanning a first remaining region of the substrate using a second electron beam; and
  detecting a second defect, wherein the first remaining region of the substrate is defined by excluding a first portion in which the first defect is positioned from the region of the substrate,
  wherein detecting the first defect includes:
    primarily scanning the region of the substrate using the first electron beam to obtain a first image; and
    applying a first defect detection sensitivity to the first image to detect the first defect,
  wherein detecting the second defect includes:
    secondarily scanning the first remaining region of the substrate using the second electron beam;
    obtaining a second image; and applying a second defect detection sensitivity to the second image in order to detect the second defect, wherein the second defect detection sensitivity is higher than the first defect detection sensitivity and wherein a size of second defect is smaller than a size of the first defect, and wherein obtaining the second image includes:

providing the second electron beam with an intensity higher than that of the first electron beam; and secondarily scanning the first remaining region of the substrate using the second electron beam in order to provide the second image with a visibility higher than that of the first image.

\* \* \* \* \*